(12) United States Patent
Yoo et al.

(10) Patent No.: US 8,188,542 B2
(45) Date of Patent: May 29, 2012

(54) FIELD EFFECT TRANSISTORS INCLUDING VARIABLE WIDTH CHANNELS AND METHODS OF FORMING THE SAME

(75) Inventors: Seung-Han Yoo, Seongnam-si (KR); Dae-Lim Kang, Hwaseong-si (KR); Young-Chan Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 857 days.

(21) Appl. No.: 12/024,319

(22) Filed: Feb. 1, 2008

(65) Prior Publication Data

US 2008/0185666 A1 Aug. 7, 2008

(30) Foreign Application Priority Data

Feb. 5, 2007 (KR) .................. 10-2007-0011692

(51) Int. Cl.
*H01L 29/66* (2006.01)
(52) U.S. Cl. ............. 257/342; 257/E29.255; 438/194; 438/286
(58) Field of Classification Search .......... 257/335–345, 257/347, 349, E29.255–E29.256, E29.012–E29.028, 257/E29.066–E29.067; 438/286, 194
See application file for complete search history.

(56) References Cited

U.S. PATENT DOCUMENTS

| | | | |
|---|---|---|---|
| 6,489,657 B1 | 12/2002 | Mori | |
| 7,151,296 B2 * | 12/2006 | Wu et al. | 257/328 |
| 7,485,925 B2 * | 2/2009 | Chen | 257/341 |
| 2001/0038134 A1 * | 11/2001 | Kumashiro | 257/394 |
| 2002/0089001 A1 * | 7/2002 | Lin | 257/288 |
| 2005/0028232 A1 | 2/2005 | Mahajan | |
| 2005/0282321 A1 * | 12/2005 | Hsu | 438/197 |
| 2007/0138552 A1 * | 6/2007 | Chang et al. | 257/344 |

FOREIGN PATENT DOCUMENTS

| | | |
|---|---|---|
| JP | 3-180073 A | 8/1991 |
| JP | 3-236283 A | 10/1991 |
| JP | 6-224391 A | 8/1994 |
| JP | 2003-282723 A | 10/2003 |
| KR | 10-2001-0039893 A | 5/2001 |
| KR | 10-2004-0033775 A | 4/2004 |

* cited by examiner

*Primary Examiner* — Matthew W Such
*Assistant Examiner* — Ali Naraghi
(74) *Attorney, Agent, or Firm* — Myers Bigel Sibley & Sajovec, P.A.

(57) ABSTRACT

A field effect transistor includes a first substrate region having a channel region and a second substrate region where a heavily doped region is formed. The channel region includes a first portion having a first width and a second portion having a second width larger than the first width. Related fabrication methods are also described.

32 Claims, 13 Drawing Sheets

FIELD EFFECT TRANSISTORS INCLUDING VARIABLE WIDTH CHANNELS AND METHODS OF FORMING THE SAME

CROSS-REFERENCE TO RELATED APPLICATION

This application claims the benefit under 35 U.S.C. §119 of Korean Patent Application No. 10-2007-0011692, filed on Feb. 5, 2007, the disclosure of which is hereby incorporated herein by reference in its entirety as if set forth fully herein.

BACKGROUND

The present invention relates to semiconductor devices and methods of forming the same, and more particularly to field effect transistors, also referred to herein as "MOS transistors", and methods of forming the same.

Some semiconductor devices may be used with high voltages. High voltage devices may be used to control high voltage or may be used in a circuit that requires high breakdown voltage (BV). A MOS transistor is a widely used high voltage-control device which consumes relatively low power. A conventional high voltage-control MOS transistor is described below with reference to the drawings.

FIG. 1 is a plan view of a conventional transistor, and FIG. 2 is a cross-sectional view cut along I-I' line of FIG. 1.

Referring to FIGS. 1 and 2, field oxide 2 is disposed on a semiconductor substrate 1 to define a first region 3 and a second region 4 which are spaced from each other. A gate 7 is placed along the top of the first region 3 and it also covers a portion of field oxide 2 between the first and the third regions 3 and 4. A gate oxide 6 is interposed between the gate 7 and the top surface of the first region 3. The first region 3 which is below the gate 7 is a channel region.

A drain region is formed in the semiconductor substrate 1 on one portion of the channel region. The drain region is formed in a double diffused drain (DDD) structure. In other words, the drain region includes a lightly doped region 5 and a heavily doped region 8. The heavily doped region 8 is formed in the second region 4 and the lightly doped region 5 is formed in the semiconductor substrate 1 on one portion of the channel region to surround the heavily doped region 8. The lightly doped region 5 surrounds the heavily doped region 8 so as to lower the breakdown voltage between the drain region and the semiconductor substrate 1.

The first region 3 having the channel region has a first width 10 along a channel width direction, and the second region 4 has a second width 11 along the channel width direction. Generally the first width 10 of the first region is larger than the second width 11 of the second region 4. The first width 10 of the first region may be larger than the width along the channel width direction of the lightly doped region 5. This is arranged in order to reduce or prevent a short circuit between the drain region and a source region (not shown) each disposed on both sides of the gate 7.

The lightly doped region 5 is formed not only in the second region 4 but also formed under the field oxide 2. As a result, if the first width 10 of the first region 3 is equal or smaller than the second width 11 of the second region 4, the lightly doped region 5 and the source region may be electrically connected. In such cases, a defect may occur in the MOS transistor that control high voltage. Therefore, in order to reduce or prevent a short circuit between the drain region and source region the first width 10 of the first region 3 is formed in a larger than the second 11 with of the second region 4.

However, problems may also occur as a result of the first width 10 of the first region 3 being larger than the second width 11 of the second region 4. For example, an electric field 9 may be converged on one edge of the heavily doped region 8, as shown in FIG. 1, while the high voltage-control MOS transistor is turned on. Accordingly, a breakdown voltage in a turned on state (hereafter, turn-on breakdown voltage) of the high voltage-control MOS transistor may be decreased. As a result, a defect may occur in the high voltage-control MOS transistor. In FIG. 1, the arrow direction of the electric field 9 indicates movement direction of the electrons. In other words, the electric field 9 implies an electric field from the point of view of the electrons.

SUMMARY OF THE INVENTION

Some embodiments of the present invention are directed to field effect transistors that include a field insulation layer disposed in a substrate, the field insulation layer defining a first substrate region and a second substrate region spaced apart from each other. A gate is on the first substrate region. A channel region is defined in the first substrate region under the gate, the channel region comprising a first portion having a first width and a second portion having a second width along a channel width direction that is transverse to a direction from the first substrate region to the second substrate region. A heavily doped region is in the second substrate region, and a lightly doped region is in the substrate surrounding a sidewall and a bottom surface of the heavily doped region. The first portion is interposed between the second substrate region and the second portion, and the first portion is adjacent to the field insulation layer between the first and the second substrate regions. The first width is smaller than the second width.

In other embodiments, a field effect transistor is fabricated by forming a field insulation layer defining a first substrate region and a second substrate region spaced apart from each other in a substrate. A lightly doped region is formed in the substrate. A gate is formed on the first substrate region. A heavily doped region is formed in the second substrate region. A channel region defined in the first substrate region under the gate comprises a first portion having a first width and a second portion having a second width in a channel width direction that is transverse to a direction from the first substrate region to the second substrate region. The first portion is interposed between the second substrate region and the second portion and is adjacent to the field insulation layer between the first and the second substrate region. The first width is smaller than the second width, and the lightly doped region surrounds a sidewall and a bottom surface of the heavily doped region.

A field effect transistor according to yet other embodiments of the present invention includes a field insulation layer in a substrate that is configured to define first and second substrate regions that are spaced apart from one another. The field insulation layer that defines the first substrate region has different widths at corresponding different lengths away from the second substrate region, so that the first substrate region also has different widths at corresponding different lengths away from the second substrate region. A gate is provided on at least a portion of the substrate region that has different widths at corresponding different lengths away from the second substrate region. A source/drain region is provided in the second substrate region. The source/drain region may comprise a heavily doped source/drain region and a lightly doped source/drain region. A second source/drain region also may be provided in the first substrate region remote from the first source/drain region, and may also include a heavily doped source/drain region and a lightly doped source/drain region.

The field insulation layer may also be configured to define a pair of second substrate regions, a respective one of which is on a respective opposite side of the first substrate region. The field insulation layer that defines the first substrate region may have different widths at corresponding different lengths from the second substrate regions, so that the first substrate region also has different widths at corresponding different lengths away from the second substrate regions. A source/drain region may be provided in each of the second substrate regions. The different widths may be symmetrical about an axis of symmetry.

DETAILED DESCRIPTION OF PREFERRED EMBODIMENTS

Figure 1:
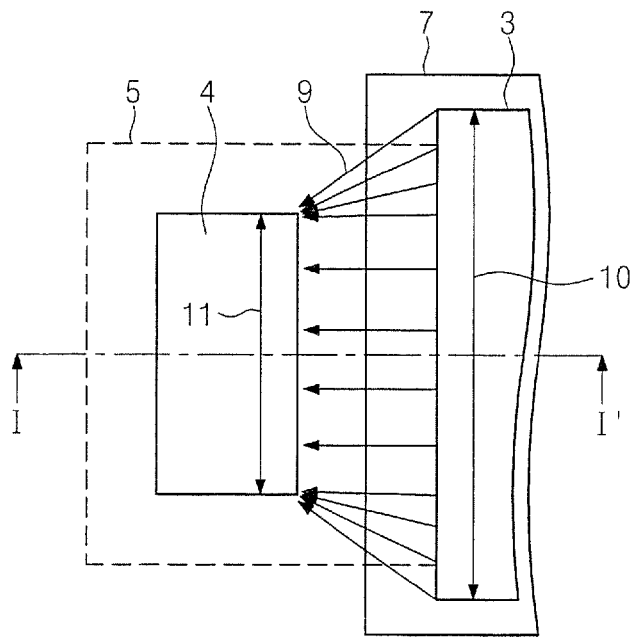
FIG. 1 is a plan view of a conventional transistor.
Figure 2:
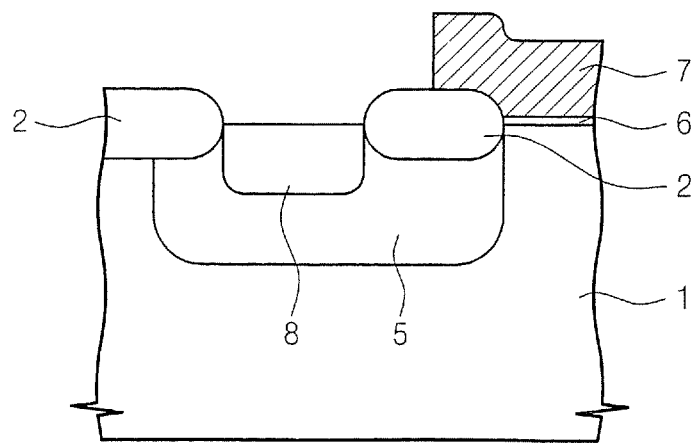
FIG. 2 is a cross-sectional view cut along I-I' line of FIG. 1.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. In contrast, the term "directly" means that there are no intervening elements. As used herein, the term "and/or" includes any and all combinations of one or more of the associated listed items.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another region, layer or section. Thus, a first embodiment, region, layer or section discussed below could be termed a second embodiment, region, layer or section, and, similarly, a second embodiment, region, layer or section could be termed a first embodiment, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" (and variants thereof), when used herein, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
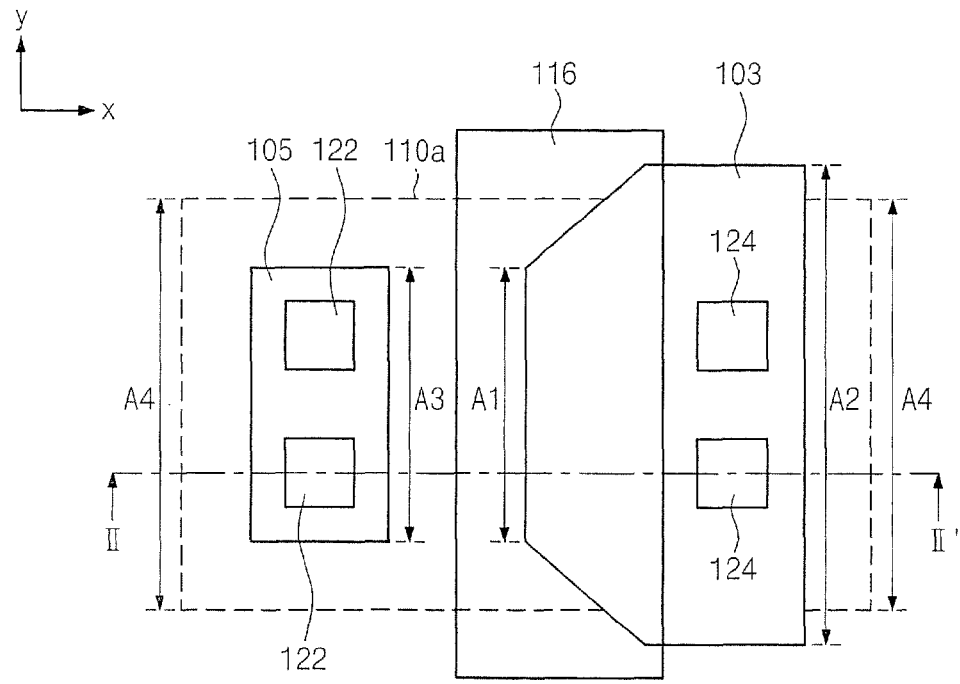
FIG. 3A is a plan view of a device according to some embodiments of the present invention.
Figure 3B:
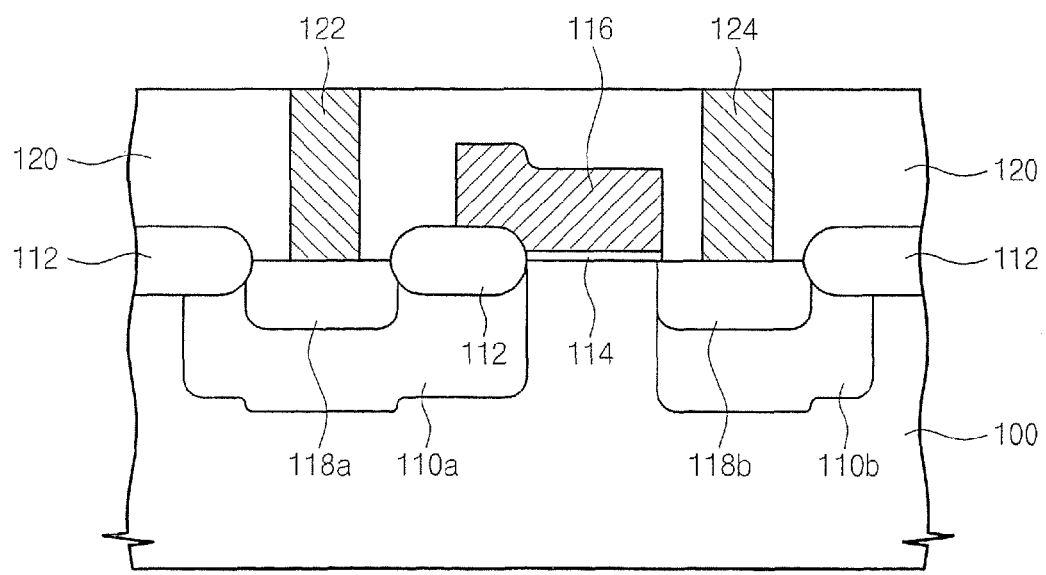
FIG. 3B is a cross-sectional view cut along II-II' line of FIG. 3A.

FIG. 3A is a plan view of a device according to some embodiments of the present invention, and FIG. 3B is a cross-sectional view cut along II-II' line of FIG. 3A.

Referring to FIG. 3A and FIG. 3B, a field insulation layer 112 is disposed in a substrate such as a semiconductor substrate 100, the field insulation layer 112 defining a first substrate region 103 and a second substrate region 105. The field insulation layer 112 may be a thermal oxide. The first substrate region 103 and the second substrate region 105 are spaced apart from each other. The first and the second substrate regions 103 and 105 are parts of the semiconductor substrate 100 which are surrounded by the field insulation layer 112. The semiconductor substrate 100 is doped with a first conductivity type dopant.

A gate 116 is placed along the top of the first substrate region 103. Also, the gate 116 is extended to cover a portion of the field insulation layer 112 between the first and the second substrate regions 103 and 105. A gate insulation layer 114 is interposed between the gate 116a and the first substrate region 103.

A channel region is defined by the first substrate region 103 under the gate 116. The channel region includes a first portion having a first width A1 along a channel width direction and a second portion having a second width A2 along the channel width direction. In FIG. 3A, the x axis direction corresponds to the channel length direction and the y axis direction corresponds to the channel width direction. In other embodiments, the x and y axes may signify the opposite directions. As used herein, and consistent with general designations for field effect transistors, the length direction extends between the source/drain regions of the device (i.e., from the first substrate region 103 to the second substrate region 105), so that a greater length defines greater spacing between the source/drain regions, and a smaller length defines smaller spacing. Moreover, the width direction generally is transverse to the length direction.

The second width A2 is larger than the first width A1. The first portion of the first width A1 is disposed between the second substrate region 105 and the second width A2. In other words, the first portion of the first width A1 is disposed closer to the second substrate region 105. The first portion of the first width A1 is adjacent to the field insulation layer 112 between the first and the second substrate regions 103 and 105. As shown, the channel width of the channel region may be gradually lengthened from the first portion of the channel region to the second portion of the channel region, i.e. the sides connecting edges of the first and the second portions of the channel region may be a slanted shape, and may be linear. In some embodiments, a major portion of the channel region is wider than the width A1, as shown.

The second substrate region 105 has a third width A3 along the channel width direction. The second width A2 is larger than the third width A3. The first width A1 may be equal to or smaller than the third width A3, or it may be half size of or larger than the third width A3.

A drain region is formed in the semiconductor substrate 100 on one portion of the channel region. As used herein, the terms "source" and "drain" are used interchangeably, and may be referred to generically as a "source/drain" region. The drain region includes a lightly doped drain region 110a and a heavily doped drain region 118a. The heavily doped drain region 118a is formed on the entire surface of the second substrate region 105, and the lightly doped drain region 110a surrounds the sidewall and bottom surface of the heavily doped drain region 118a. In other words, the lightly doped drain region 110a is formed in the semiconductor substrate 100, under the field insulation layer 112 on one portion of the channel region and under the heavily doped drain region 118a. The lightly doped drain region 110a and heavily doped drain region 118a are doped with a second conductivity type dopant. Therefore, the drain region and the semiconductor substrate 100 form a PN junction. The lightly doped drain region 110a is doped with less concentrated dopant than the heavily doped drain region 118a. Therefore, the drain region is formed in a double diffused drain structure so that the breakdown voltage between the drain region and the semiconductor substrate 100 may be increased.

A source region is formed in the first substrate region 103 on one portion of the gate 116. The source region includes a lightly doped source region 110b and a heavily doped source region 118b. The heavily doped source region 118b is formed on an entire portion of the first substrate region 103 on one portion of the gate 116. The lightly doped source region 110b surrounds at least a portion of sidewall of the heavily doped source region 118b. As shown, the lightly doped source region 110b may not cover the adjoining sidewall of the channel region of the heavily doped source region 118b. Alternatively, the lightly doped source region 110b may be in a form that surrounds the entire sidewall of the heavily doped source region 118b. The lightly doped source and the heavily doped source regions 110b and 118b are doped with a second conductivity dopant, and the lightly doped source region 110b may have a lower dopant concentration than the heavily doped source region 118b. The width along the channel width direction of the first substrate region 103 is equal in length to the second width A2, the first substrate region 103 where the source heavily doped region 118b is formed.

The drain region and the source region are formed in an asymmetrical structure centering the gate 116. In other words, the heavily doped drain region 118a is spaced from the channel region by the field insulation layer 112, but the field insulation layer 112 is not provided between the heavily doped source region 118b and the channel region. Thus, the heavily doped source region 118b forms a junction with the channel region.

The lightly doped drain region 110a has a fourth width A4 along the channel width direction. Also, the width of the lightly doped source region 110b along the channel width direction is equal in length to the fourth width A4. The second width A2 of a second portion in the channel region is larger than the fourth width A4. Therefore, the lightly doped drain and source regions 110a and 110b may be reduced or prevented from an electrical short circuit by the second portion of the channel region.

Although not shown in the drawings, gate spacers may be disposed on both sidewalls of the gate 116. An interlayer dielectric 120 covers the entire surface of the semiconductor substrate 100. At least one first contact plug 122 penetrates the interlayer dielectric 120 to be connected to the drain heavily doped region 118a. At least one second contact plug 124 penetrates the interlayer dielectric 120 to be connected to the source heavily doped region 118b.

The drain region, the source region and the gate 116 can constitute a high voltage-control MOS transistor.

According to the aforementioned structures of the high voltage-control MOS transistor, the channel region includes a first portion relatively closer to the heavily doped drain region 118*a*, and a second portion relatively further from the heavily doped drain region 118*b*. The first width A1 of the first portion is smaller than the second width A2 of the second portion. Therefore, the width of the first portion of the channel region is narrowed to reduce or prevent the electric field from being converged at both edges of the heavily doped drain region 118*a*. As a result, turn-on breakdown voltage of the high voltage-control MOS transistor may be improved.

Also, by making the second portion of the channel region to have a relatively larger second width A2, a short circuit between the drain and the source lightly doped regions 110*a* and 110*b* may be reduced or prevented.

In addition, by making the second portion of the channel region adjoin a large area of the source region, decrease of the turn-on electricity amount of the high voltage-control MOS transistor may be reduced or minimized.

In case the first conductivity type of dopant is a p-type, and the second conductivity type of dopant is an n-type, the aforementioned high voltage-control MOS transistor is an NMOS transistor. In contrast, in case the first conductivity type of dopant is an n-type, and the second conductivity type is a p-type, the high voltage-control MOS transistor is a PMOS transistor.

The channel region may take different forms. This is described referring to FIG. 4A, FIG. 4B, FIG. 4C and FIG. 4D. In these drawings, only a first and a second substrate regions and lightly doped drain and source regions are illustrated in order to emphasize the features of the various exemplary modifications.

Figure 4A:
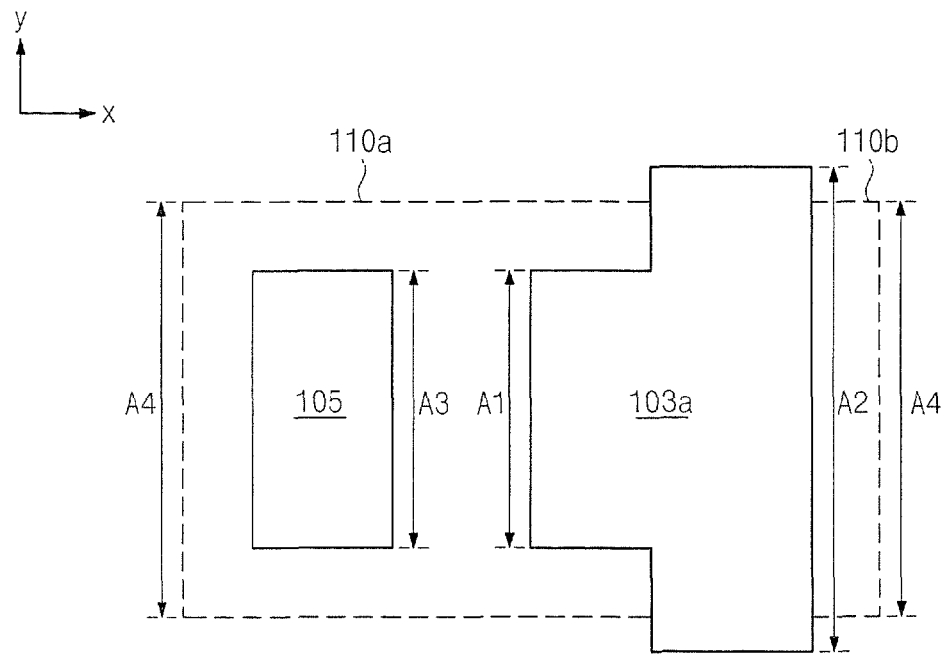
FIG. 4A is a plan view of another device according to other embodiments of the present invention.

FIG. 4A is a plan view of a semiconductor device according to some embodiments of the present invention.

Referring to FIG. 4A, the first substrate region 103*a* includes channel region. The channel region includes a first portion of the first width A1 and a second portion of the second width A2. The second width A2 is larger than the first width A1. The width of the channel region may widen abruptly (step wise) at an inflection point moving from the first portion to the second portion, i.e. the channel region only includes the region having the first width A1 and the region having second width A2.

Figure 4B:
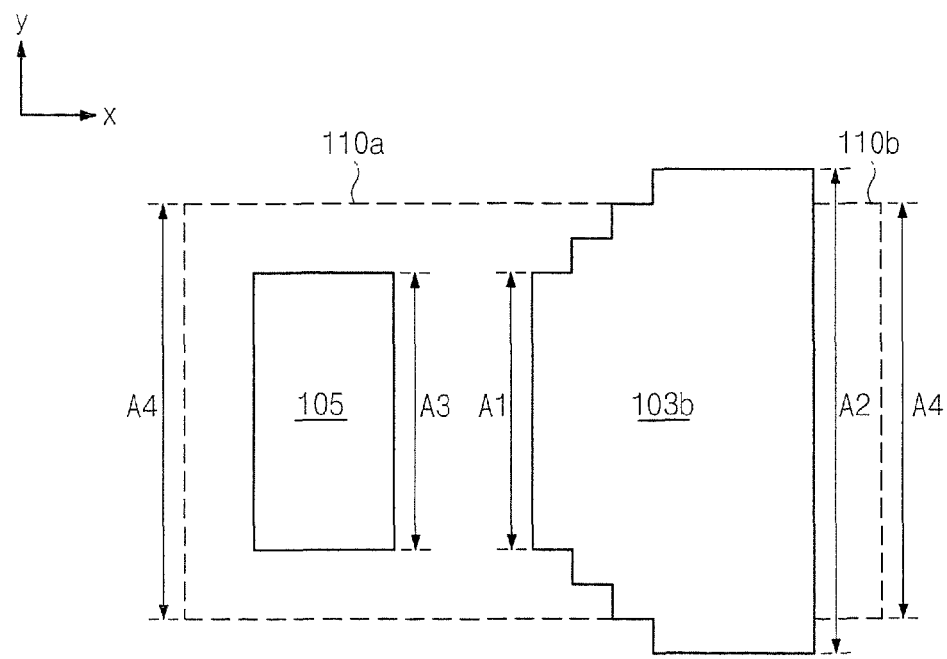
FIG. 4B is a plan view of another device according to other embodiments of the present invention.

FIG. 4B is a plan view of another semiconductor device according to other embodiments.

Referring to FIG. 4B, the width of the channel region of the first substrate region 103*b* may increase in several steps moving from the first portion of the first width A1 to the second portion of the second width A2.

Figure 4C:
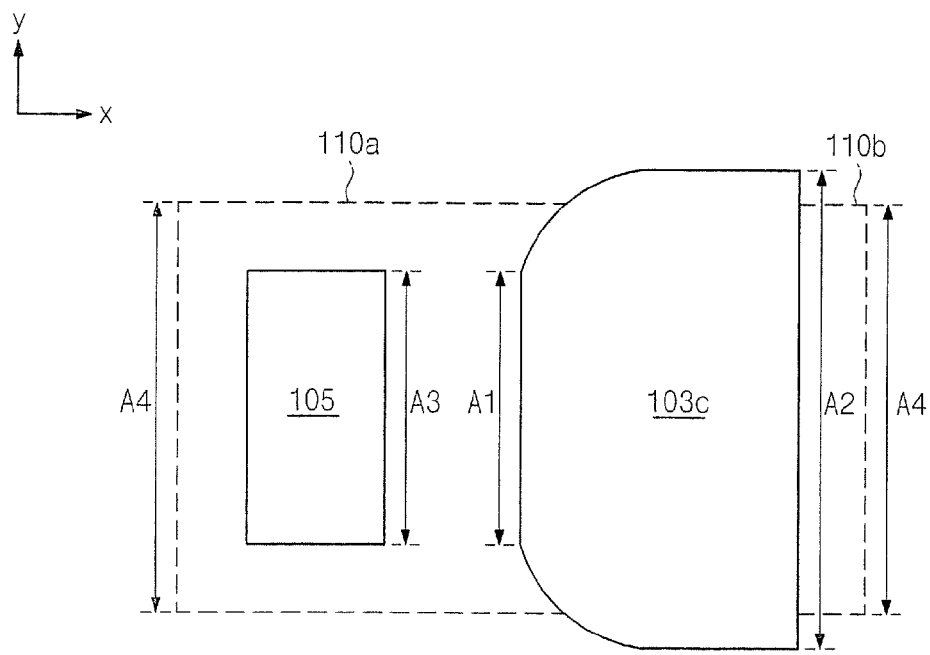
FIG. 4C is a plan view of yet another device according to yet other embodiments of the present invention.

FIG. 4C is a plan view of yet another semiconductor device according to other embodiments of the present invention.

Referring to FIG. 4C, the first substrate region 103*c* and the second substrate region 105 of semiconductor substrate 100 are spaced from each other. The channel region in the first substrate region 103*c* includes a first portion of the first width A1 and a second portion of the second width A2. As shown, the sides connecting edges of the first and second portions of the channel region may be curved.

Figure 4D:
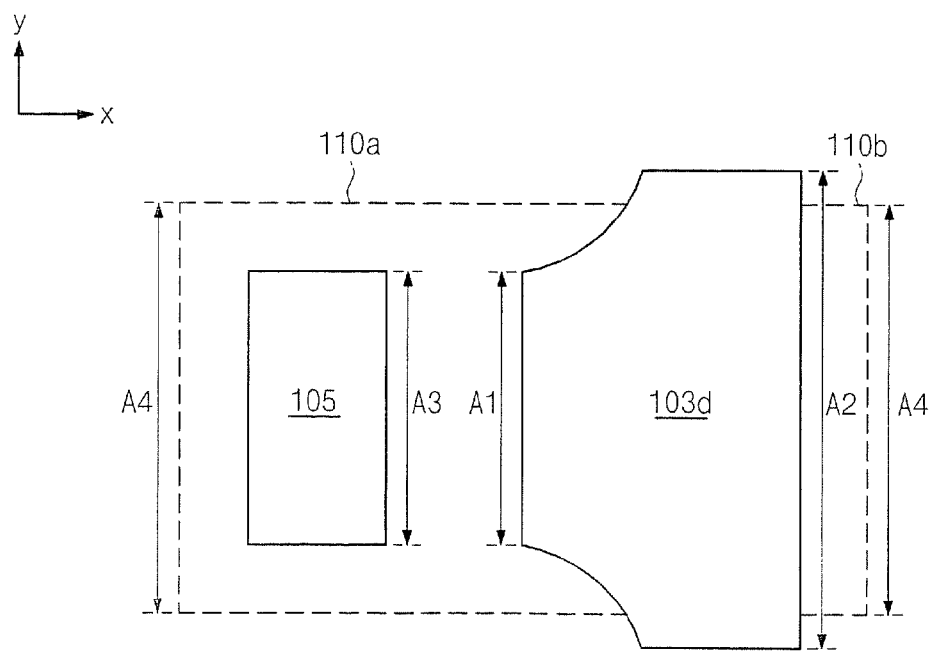
FIG. 4D is a plan view of still another device according to still other embodiments of the present invention.

FIG. 4D is a plan view of another device according to other embodiments of the present invention.

Referring to FIG. 4D, the first substrate region 103*d* includes a channel region. The sides connecting the first portion of the first width A1 and the second portion of the second width A2 of the channel region may be concaved, as shown.

Methods of forming semiconductor devices according to various embodiments of the present invention are explained below.

Figure 5A:
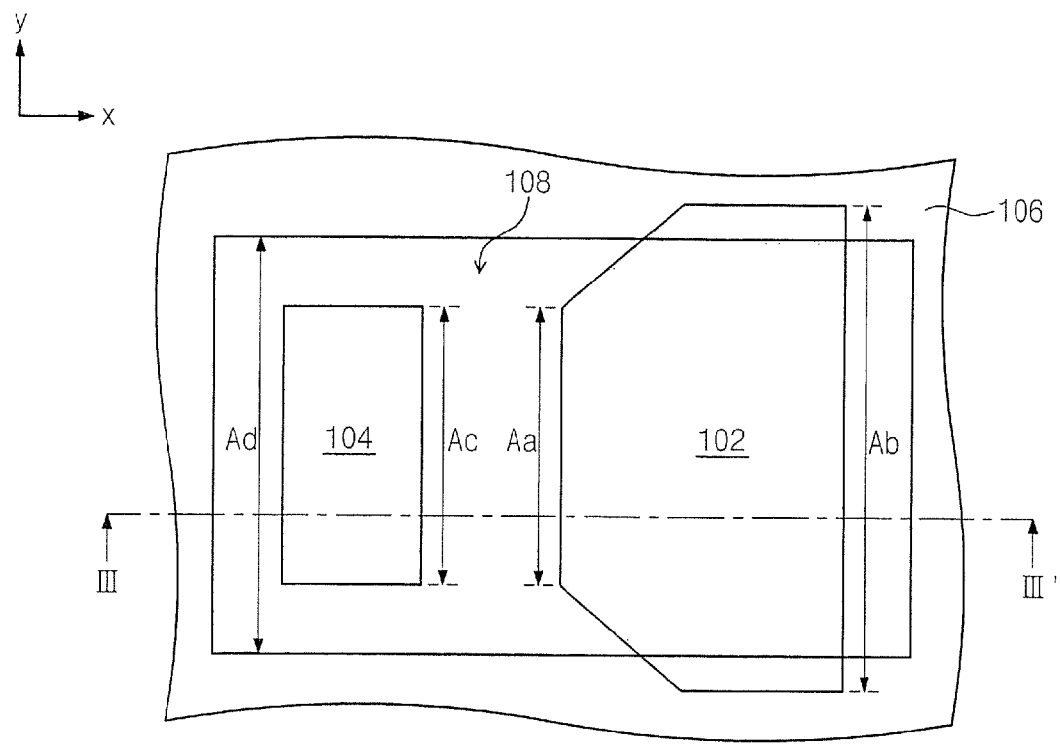
FIG. 5A, FIG. 6A and FIG. 7A are plan views of methods of forming devices according to various embodiments of the present invention.
Figure 5B:
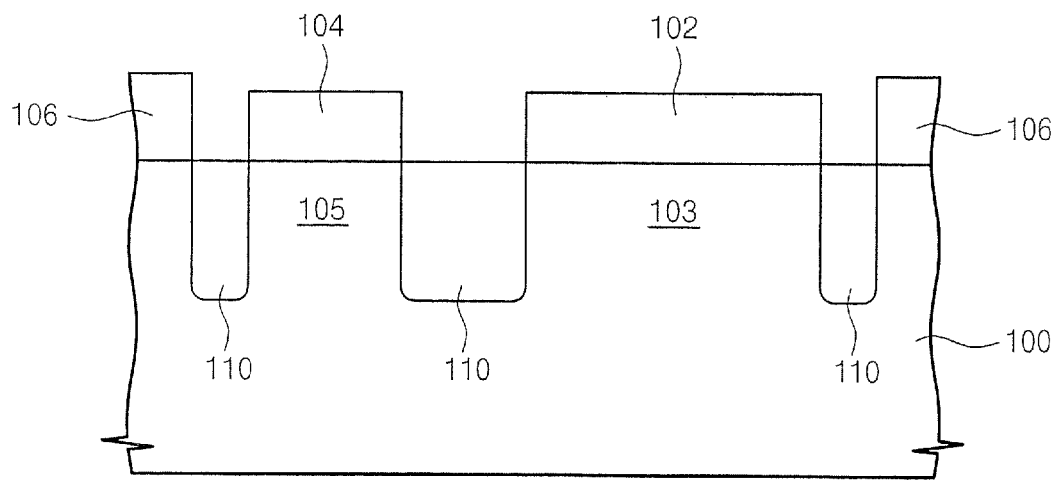
FIG. 5B, FIG. 6B and FIG. 7B are cross-sectional views cut along III-III' of FIG. 5A, FIG. 6A and FIG. 7A, respectively.
Figure 6A:
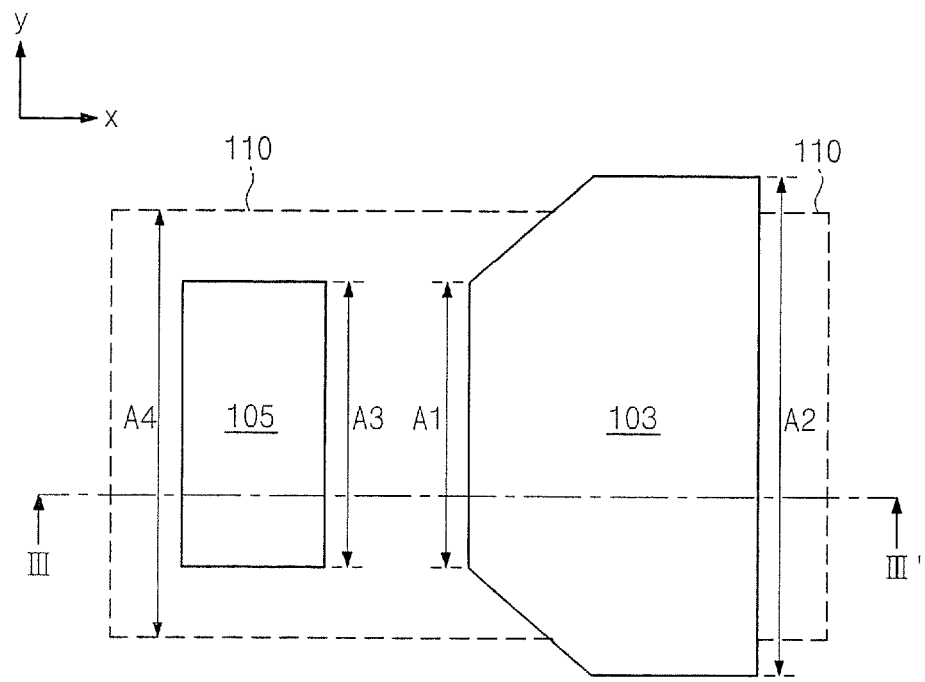
Figure 6B:
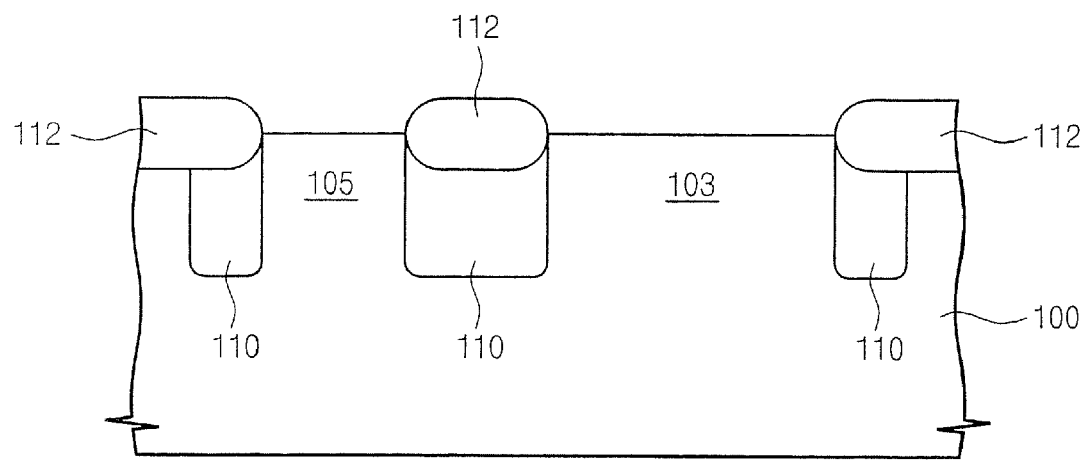
Figure 7A:
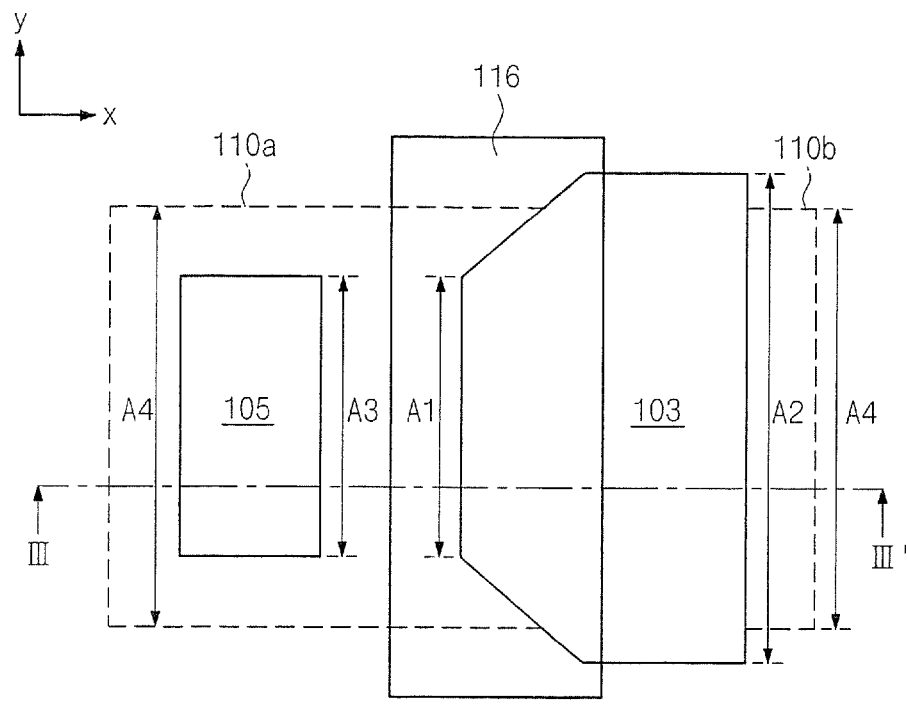
Figure 7B:
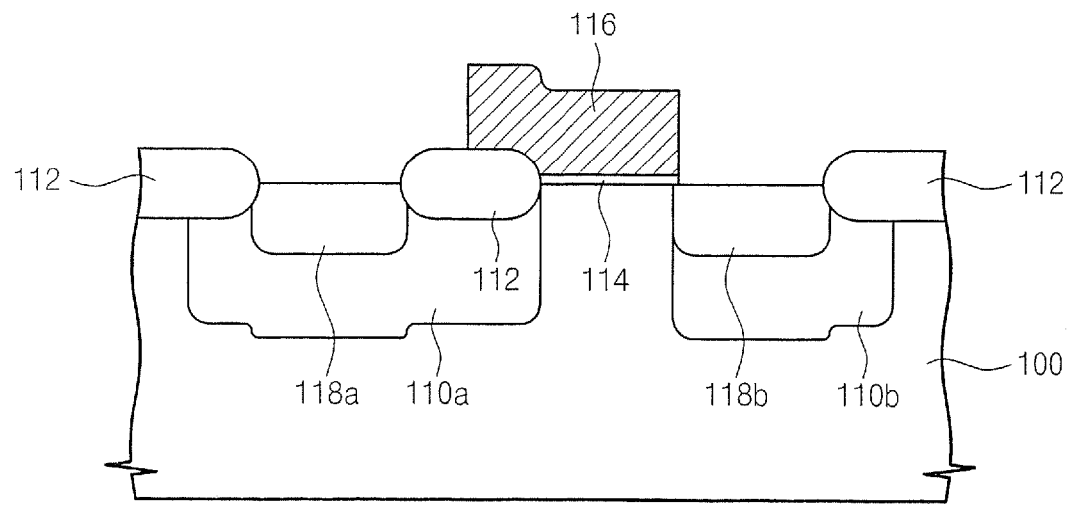

FIGS. 5A, 6A and 7A are plan views of methods of forming semiconductor devices according to embodiments of the present invention, and FIGS. 5B, 6B and 7B are cross-sectional views cut along III-III' of FIGS. 5A, 6A and 7A, respectively.

Referring to FIG. 5A and FIG. 5B, a first hard mask pattern 102 and a second hard mask pattern 104 are formed on the semiconductor substrate 100, spaced from each other. The semiconductor substrate 100 is doped with the first conductivity dopant. The semiconductor substrate 100 may be doped with the first conductivity dopant by a process of forming a well. The first substrate region 103 is defined at the semiconductor substrate 100 under the first hard mask pattern 102, and the second substrate region 105 is defined at the semiconductor substrate 100 under the second hard mask pattern 104.

The first hard mask pattern 102 includes a portion having a first width Aa and a second width Ab extended toward the same direction. The first width Aa is smaller than the second width Ab. The portion having the first width Aa is interposed between the second hard mask pattern 104 and the second width Ab. In other words, the portion having the first width Aa is disposed relatively closer to the second hard mask pattern 104, and the portion having the second width Ab is disposed relatively further (remote) from the second hard mask pattern 104. The second hard mask pattern 104 has a third width Ac along the same direction.

The first and the second hard mask patterns 102 and 104 contain material that can block implanting of dopant ions. Also, the first and the second hard mask patterns 102 and 104 may contain material than can reduce or prevent oxidation. For example, the first and the second hard mask patterns 102 and 104 may contain silicon nitride. In addition, the first and the second hard mask patterns 102 and 104 may contain silicon oxide and silicon nitride stacked sequentially.

A mask pattern 106 having an opening 108 is formed on the semiconductor substrate 100 having the first and the second hard mask patterns 102 and 104. The mask pattern 106 may be made of photosensitive film. The opening 108 exposes the first and the second hard mask patterns 102 and 104 simultaneously. The opening 108 has a fourth width Ad in the width direction. The fourth width Ad is smaller than the second width Ab, and larger than the first and the third widths Aa and Ac. Accordingly, while the entire portion of the second hard mask pattern 104 is exposed to the opening 108, both edges of the portion having the second width Ab on the first hard mask pattern 102 are covered with the mask pattern 106. The opening 108 defines edges of the lightly doped drain and source regions 110*a* and 110*b* illustrated in FIG. 3A.

A first ion implantation process is performed using as a mask the first and the second hard mask patterns 102 and 104, and the mask pattern 106. The first ion implantation process is to implant the second conductivity type dopant ions at a low dose. Accordingly, a preliminary lightly doped region 110 is formed on the semiconductor substrate 100 in the vicinity of the first and the second hard mask patterns 102 and 104, the hard mask patterns formed within the opening 108.

Referring to FIG. 6A and FIG. 6B, the mask pattern 106 is removed. Then a field insulation layer 112 is formed on the semiconductor substrate 100 using the first and the second hard mask patterns 102 and 104 as a mask. The field insulation layer 112 surrounds a sidewall of the first substrate region 103 and a sidewall of the second substrate region 105. The field insulation layer 112 may be formed by an oxidation process. Alternatively, the field insulation layer 112 may be in a form of an insulation layer that fills trench. FIG. 6B is the field insulation layer 112 formed through an oxidation process.

After forming the field insulation layer 112, the first and the second hard mask patterns 102 and 104 are removed to expose the first and the second substrate regions 103 and 105. The first width A1 and the second width A2 of the first substrate region 103 respectively correspond to the first width Aa and the second width Ab of the first hard mask pattern 102. The first and the second widths A1 and A2 of the substrate region 103 are substantially equal in length to the first and the second widths Aa and Ab of the first hard mask pattern 102 respectively. In other words, as a result of formation of the field insulation layer 112, the first and the second widths A1 and A2 in the first substrate region 103 may be minutely smaller than the first and the second widths Aa and Ab of the first hard mask pattern 102. The third width A3 of the second substrate region 105 is substantially equal in length to the third width Ac of the second hard mask pattern 104. The fourth width A4 of the very exterior edges of the preliminary lightly doped region 110 may be substantially equal in length to the fourth width Ad of the opening 108. As result of dopant diffusion, the fourth width A4 of the preliminary lightly doped region 110 may be larger than the fourth width Ad of the opening 108.

Referring to FIG. 7A and FIG. 7B, the gate insulation layer 114 is formed on top surface of the first and the second substrate regions 103 and 105, a gate conductive layer is formed on the semiconductor substrate 100 having the gate insulation layer 114, and the gate conductive layer is patterned to form a gate 116. The gate 116 is placed along the top of the first substrate region 103. Specifically, the gate 116 runs over the first substrate region 103 adjacent to the field insulation layer 112 interposed between the first and the second substrate regions 103 and 105. Also, the gate 116 covers a portion of the field insulation layer 112 interposed between the first and the second substrate regions 103 and 105.

A second ion implantation process is performed to the second substrate region 105 and the first substrate region 103 on one side of the gate 116. The process is performed to form a lightly doped drain region 110a and lightly doped source region 110b. The second ion implantation process is to implant the second conductivity type dopant ions at a low dose. The first and the second ion implantation processes may be performed at equal dose.

In some embodiments, the second ion implantation process may be omitted. In this case, the dopant of the preliminary lightly doped region 110 is diffused to the second substrate region 105 and the first substrate region 103. As a result, the lightly doped drain and source regions 110a and 110b may be formed.

After the lightly doped drain and source regions 110a and 110b are formed, a third ion implantation process is performed to the second substrate region 105 and the first substrate region 103 on one side of the gate 116, using the gate 116 and the field insulation layer 112 as mask. This results in formation of the heavily doped drain region 118a and the heavily doped source region 118b. The third ion implantation process may be done by implanting the second conductivity dopant ions in a high dose. The high dose of the third ion implantation process is higher than the low dose of the first and the second ion implantation processes.

Then the interlayer dielectric 120 of FIG. 3B is formed on the semiconductor substrate 100, and the first and the second contact plugs 122 and 124 are formed as illustrated in FIG. 3A and FIG. 3B. As a result, the semiconductor device illustrated in FIG. 3A and FIG. 3B may be realized.

Alternatively, in methods of forming the semiconductor device, the first hard mask pattern 102 may be formed to define the first substrate regions 103a, 103b, 103c, and 103d shown in FIGS. 4A, 4B, 4C and 4D. As a result, the semiconductor device illustrated in FIGS. 4A, 4B, 4C and 4D may be realized.

In the high voltage-control MOS transistor according to other embodiments of the present invention, the source and drain regions have a symmetrical structure centering the gate. Also channel region has a symmetrical structure.

Figure 8A:
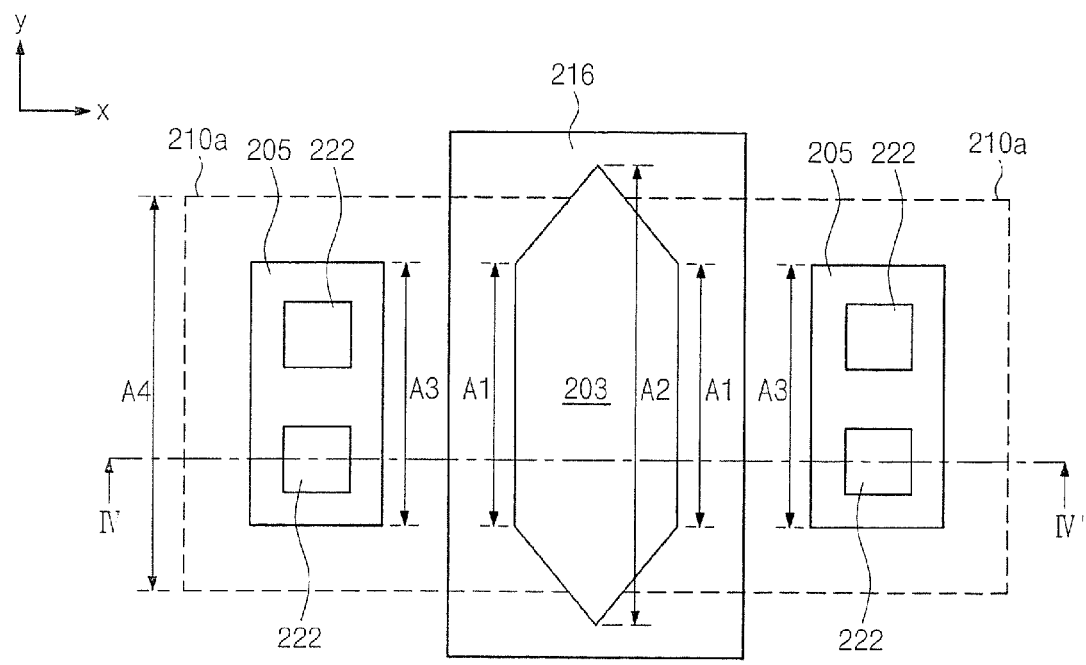
FIG. 8A is a plan view of another device according to other embodiments of the present invention.
Figure 8B:
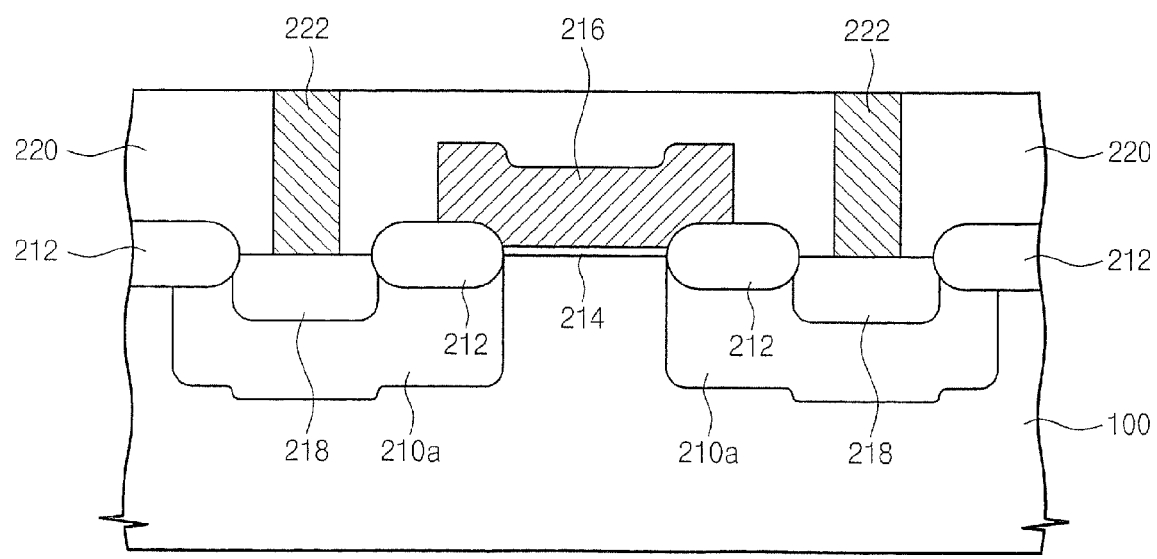
FIG. 8B is a cross-sectional view cut along IV-IV' of FIG. 8A.

FIG. 8A is a plan view of a semiconductor device according to other exemplary embodiments of the present invention. FIG. 8B is a cross-sectional view cut along IV-IV' of FIG. 8A.

Referring to FIG. 8A and FIG. 8B, field insulation layer 212 defining a first substrate region 203 and a pair (i.e., a couple) of second substrate regions 205 is disposed on a substrate, such as semiconductor a substrate 200. The first and the second substrate regions 203 and 205 are spaced from each other. The first substrate region 203 is interposed between a pair of the second substrate regions 205. The semiconductor substrate 200 is doped with the first conductivity type dopant.

A gate 216 runs over the first substrate region 203. The gate 216 is placed on top of the entire surface of the first substrate region 203. Also the gate 216 covers portions of the field insulation layers 212 on both sides of the first substrate region 203. A gate insulation layer 214 is interposed between the gate 216 and the first substrate region 203. A channel region is defined at the first substrate region 203 under the gate 216.

The channel region includes a pair of first portions having a first width A1, and a second portion having a second width A2, both along the channel width direction. The first width A1 is smaller than the second width A2. The second portion is interposed between a pair of the first portions. Here the channel region has a symmetrical structure centering the second portion. As shown in drawing, the channel region width may be gradually increased moving from the first portion to the second portion. The first portion of the first width A1 is adjacent to the field insulation layer 212 between the first substrate region and the second substrate region 205.

A pair of the second substrate regions 205 are spaced from a pair of the first portions in the channel region defined at the first substrate region 203, respectively. A pair of the second substrate regions 205 have symmetrical structure centering the first substrate region 203. The second substrate regions 205 have a third width A3 along the channel width direction. The second width A2 is larger in length than the third width A3. The first width A1 is equal to or smaller in length than the third width A3, or the first width A1 is equal to half of the length of or larger than the third width A3.

A pair of the heavily doped regions 218 are formed on a pair of the second substrate regions 203, respectively. A pair of lightly doped regions 210a are formed on the semiconductor substrate 200 on both sides of the channel region. The lightly doped regions 210a surround a sidewall and a bottom surface of the heavily doped regions 218. In other words, the lightly doped and heavily doped regions 210a and 218 form a DDD structure. The lightly doped and heavily doped regions 210a and 218 are doped with the second conductivity type dopant.

The lightly doped regions 210a have a fourth width A4 along the channel width direction. Here the second width A2 is larger in length than the fourth width A4. Therefore, a pair of lightly doped regions 210a may be reduced or prevented from short circuit.

An interlayer dielectric 220 covers the entire surface of the semiconductor substrate 200, and a contact plug 222 penetrates the interlayer dielectric 220 to connect to the heavily doped region 218. One or a multiple contact plugs 222 may be connected to one of the heavily doped regions 218.

According to the above-described structure of high voltage-control MOS transistor, the first width A1 of the first portion in the channel region adjacent to the heavily doped region 218 is smaller than the second width A2 of the second portion in the center of the channel region. Therefore, conventional convergence of electric field at the edge of the drain region may be reduced or minimized. As a result, the turn-on breakdown voltage of high voltage-control MOS transistor may be increased.

Also, the channel region defined at the first substrate region 203 has a bilaterally symmetrical structure. Conventional electric field convergence may be reduced or minimized when high voltage is applied to either of the pair of the heavily doped regions 218.

The channel region defined at the first substrate region 203 may take other forms. This will be described below referring to drawings.

Figure 9A:
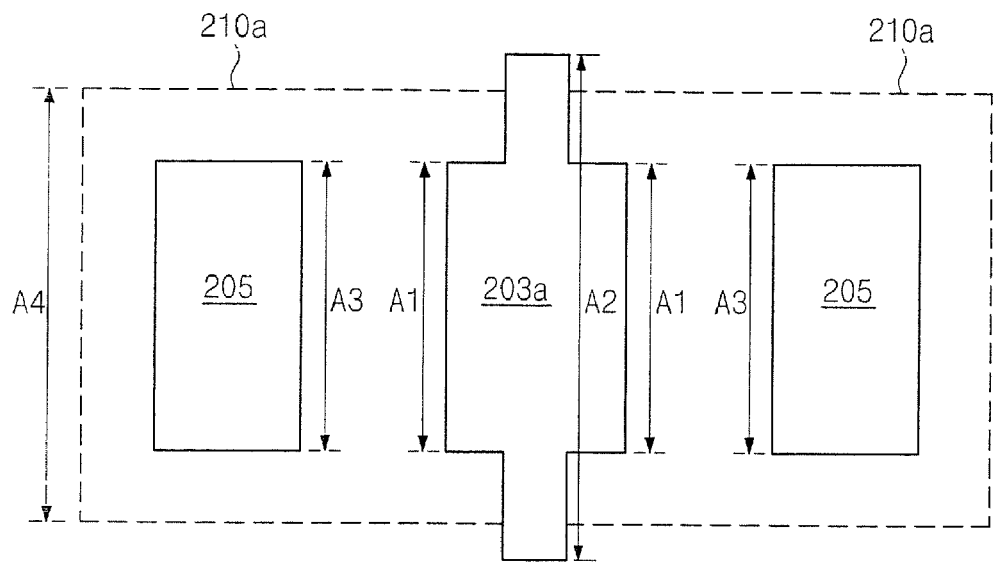
FIG. 9A is a plan view of a device according to other embodiments of the present invention.
Figure 9B:
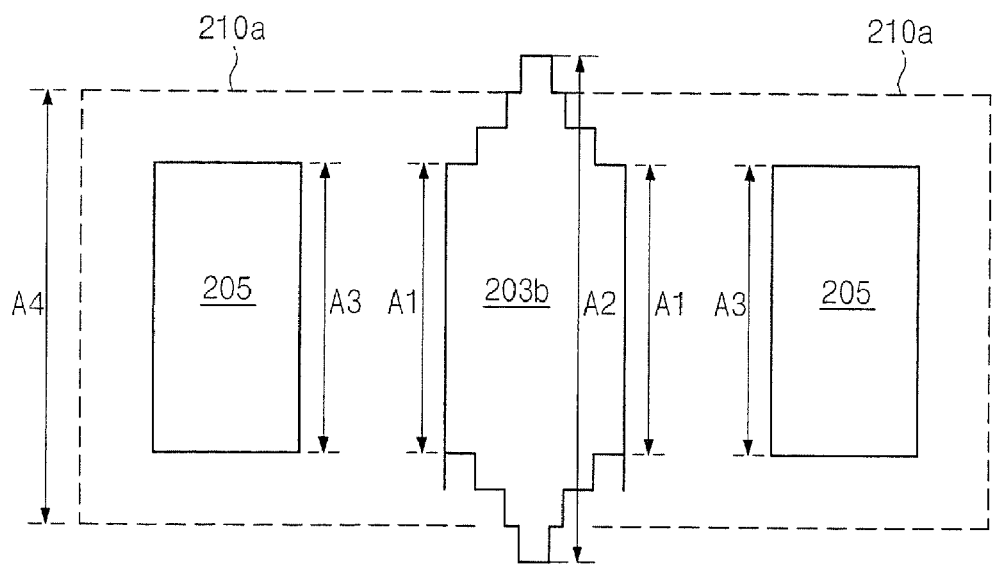
FIG. 9B is a plan view of another device according to other embodiments of the present invention.
Figure 9C:
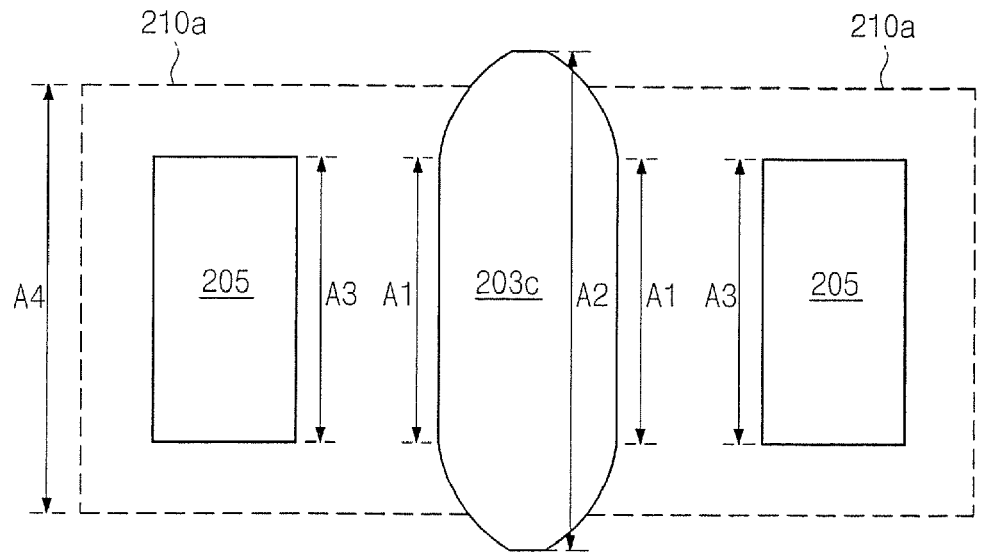
FIG. 9C is a plan view of yet another device according to other embodiments of the present invention.
Figure 9D:
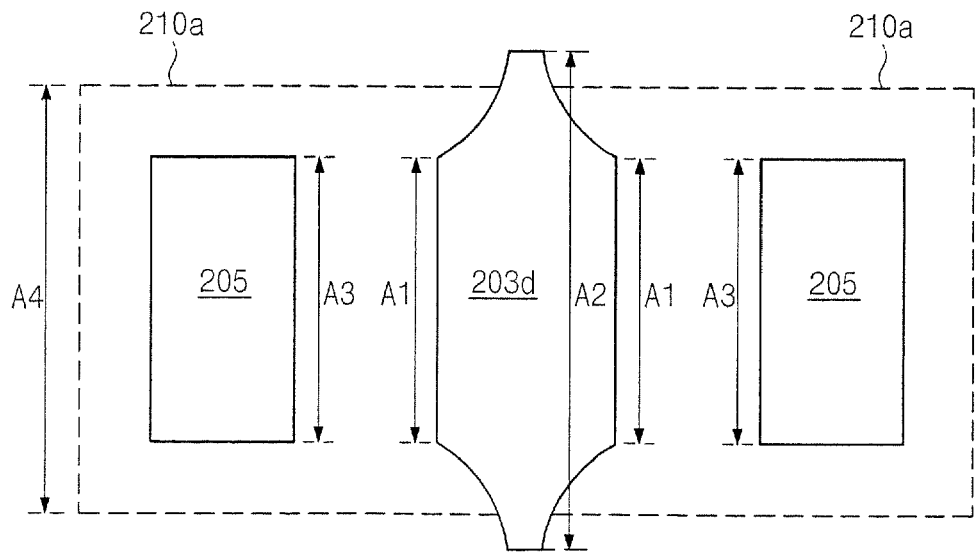
FIG. 9D is a plan view of another device according to other embodiments of the present invention.

FIG. 9A is a plan view of a semiconductor device according to other embodiments of the present invention, FIG. 9B is a plan view of another semiconductor device according to yet other embodiments, FIG. 9C is another plan view of a semiconductor device according to other embodiments, and FIG. 9D is yet another plan view of a semiconductor device according to other embodiments.

Referring to FIG. 9A, a channel region defined at a first substrate region 203a includes two portions. The two portions are a first portion of the first width A2 and a second portion of the second width A2 which is larger than the first width A1. The width of the channel region is abruptly increased from an inflection point moving from the first portion to the second portion. Also, the channel region has a bilaterally symmetrical structure centering the second portion.

Referring to FIG. 9B, the width of channel region defined at the first substrate region 203b is increased in several steps, moving from the first portion of the first width A1 to the second portion of the second width A2 in the channel region. Also in this case the channel region, i.e., the first substrate region 203b has a bilaterally symmetrical structure centering the second portion of the second width A2.

Referring to FIG. 9C, a channel region defined at the first substrate region 203c according to other embodiments includes a first portion of the first width A1 and a second portion of the second width A2. The side which connects edges of the first and the second portions is a convex-curved side. The channel region defined at the first substrate region 203c has a bilaterally symmetrical structure.

Referring to FIG. 9D, a channel region defined at the first substrate region 203d according to other embodiments includes a first portion of the first width A1 and a second portion of the second width A2. The sides connecting edges of the first and the second portions is a concave-curved side. The channel region defined at the first substrate region 203d also has bilaterally symmetrical structure.

Next, methods of forming semiconductor devices according to other embodiments of the invention are described below.

FIGS. 10A to 12A are plan views of methods of forming semiconductor devices according to other embodiments of the present invention, and FIGS. 10B to 12B are cross-sectional views cut along V-V' of FIGS. 10A to 12A, respectively.

Figure 10A:
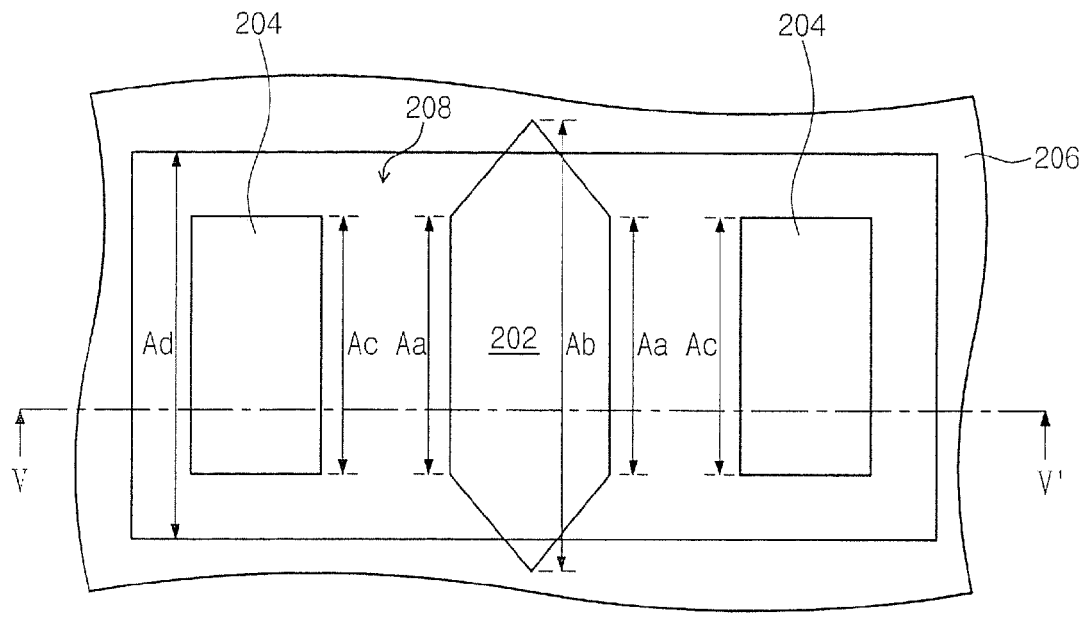
FIG. 10A, FIG. 11A, and FIG. 12A are plan views of methods of forming semiconductor devices according to other embodiments of the present invention.
Figure 10B:
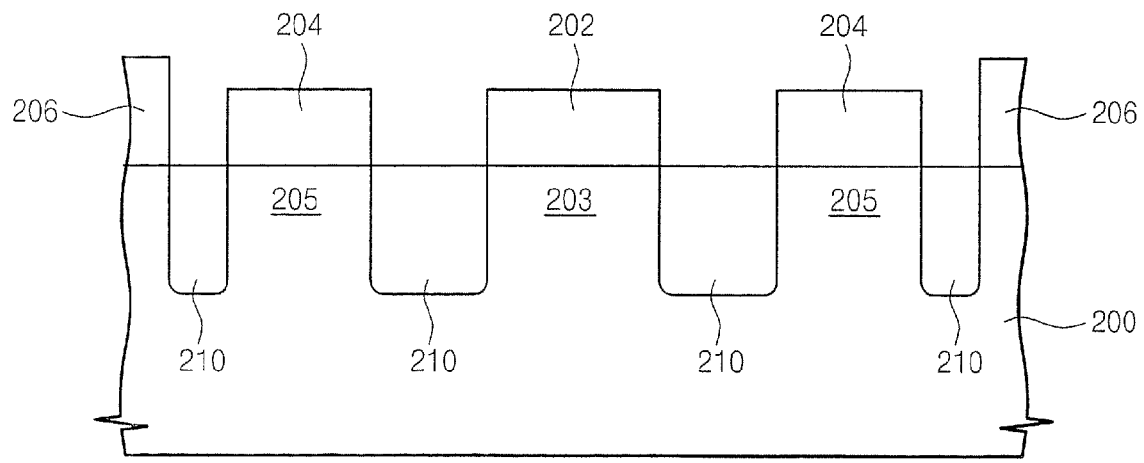
FIG. 10B, FIG. 11B and FIG. 12B are cross-sectional views cut along V-V' of FIG. 10A, FIG. 11A and FIG. 12A, respectively.

Referring to FIG. 10A and FIG. 10B, a first hard mask pattern 202 and a pair of second hard mask patterns 204 are formed on the semiconductor substrate 200. The semiconductor substrate 200 is doped with the first conductivity dopant. The first and the second hard mask patterns 202 and 204 are spaced apart from each other. The first hard mask pattern 202 is disposed between a pair of the second hard mask patterns 204. A pair of the second hard mask pattern 204 is disposed symmetrically centering the first hard mask pattern 202. A first substrate region 203 is defined at the semiconductor substrate 200 under the first hard mask pattern 202, and a second substrate region 205 is defined at the semiconductor substrate 200 under the second hard mask pattern 204.

The first hard mask pattern 202 includes a pair of first portions having a first width Aa, and a second portion having a second width Ab, extending in the same direction. A pair of the first portions of the first hard mask pattern 202 are disposed symmetrically on both sides of the second portion of the first hard mask pattern 202. The first width Aa is smaller than the second width Ab. The second hard mask pattern 204 has a third width Ac along the same direction. The second width Ab is larger than the third width Ac. The first width Aa is equal to or smaller than the third width Ac, or is equal to half the length or larger than the third width Ac. The first and the second hard mask patterns 202 and 204 may use the same material with the first and the second hard mask patterns 102 and 104 of FIG. 5A and FIG. 5B.

A mask pattern 206 having an opening 208 is formed on semiconductor substrate 200 having the second hard mask patterns 202 and 204. The mask pattern 206 may be made of photosensitive film. The opening 208 simultaneously exposes the first hard mask pattern 202 and the pair of the second hard mask patterns 204. The opening 208 has a fourth width Ad toward the same direction. The fourth width Ad is smaller than the second width Ab, and is larger than the first and the third widths Aa and Ac. Accordingly, while all of the second hard mask patterns 204 are exposed to the opening 208, both edges of the second portion having the second width Ab in the first hard mask pattern 202 are covered with the mask pattern 206. The opening 208 defines the exterior of a pair of the lightly doped regions 210a shown in FIG. 8A.

A first ion implantation process is performed using as a mask the first and the second hard mask patterns 202 and 204 and the mask pattern 206 to form a preliminary lightly doped region 210. The first ion implantation process may be performed under the same conditions as the first ion implantation process of the first exemplary embodiment.

Figure 11A:
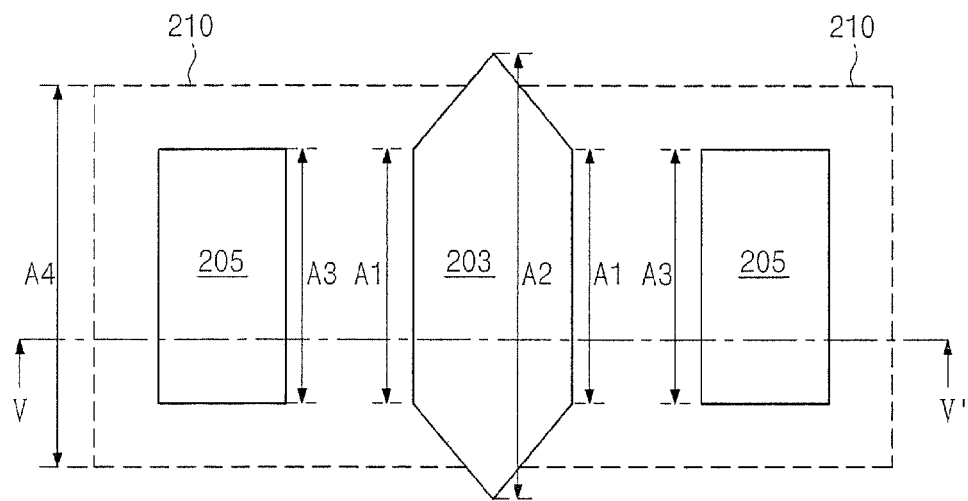
Figure 11B:
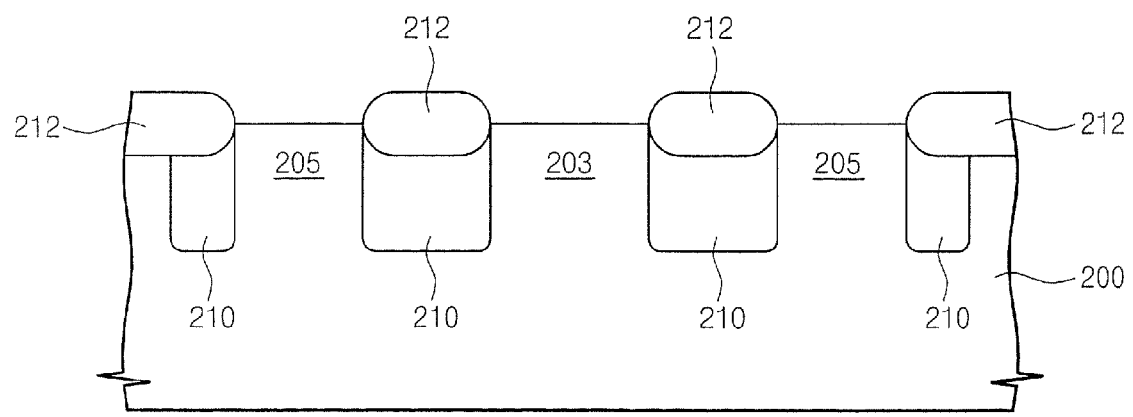

Referring to FIG. 11A and FIG. 11B, after the mask pattern 206 is removed, a field insulation layer 212 is formed on the semiconductor substrate 200 using the first and the second hard mask patterns 202 and 204 as a mask. The field insulation layer 212 surrounds a sidewall of the first substrate region 203 and a couple of the second substrate regions 205. The field insulation layer 212 may be formed in the same methods as the field insulation layer 112 shown in FIG. 6A and FIG. 6B.

Then, the first and the second hard mask patterns 202 and 204 are removed to expose the first and the second substrate regions 203 and 205. The first width A1 and the second width A2 of the first substrate region 203 are substantially equal to the first width Aa and the second width Ab of the first hard mask pattern 202, respectively. The third width A3 of the second substrate region 205 is substantially equal to the third width Ac of the second hard mask pattern 204. The fourth width A4 of the edges of the preliminary lightly doped region 210 are substantially equal to the fourth width Ad of the opening 208.

Figure 12A:
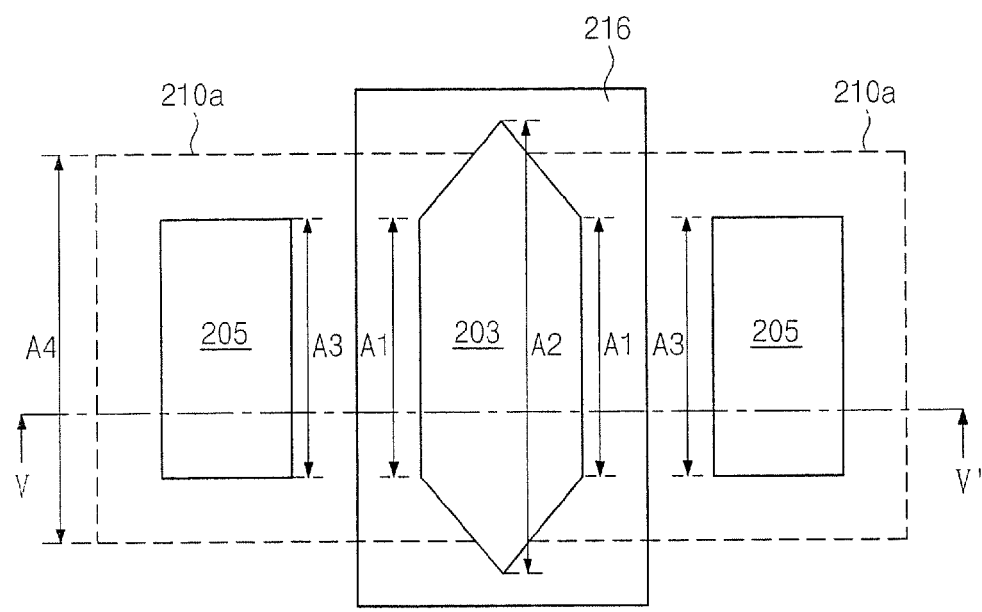
Figure 12B:
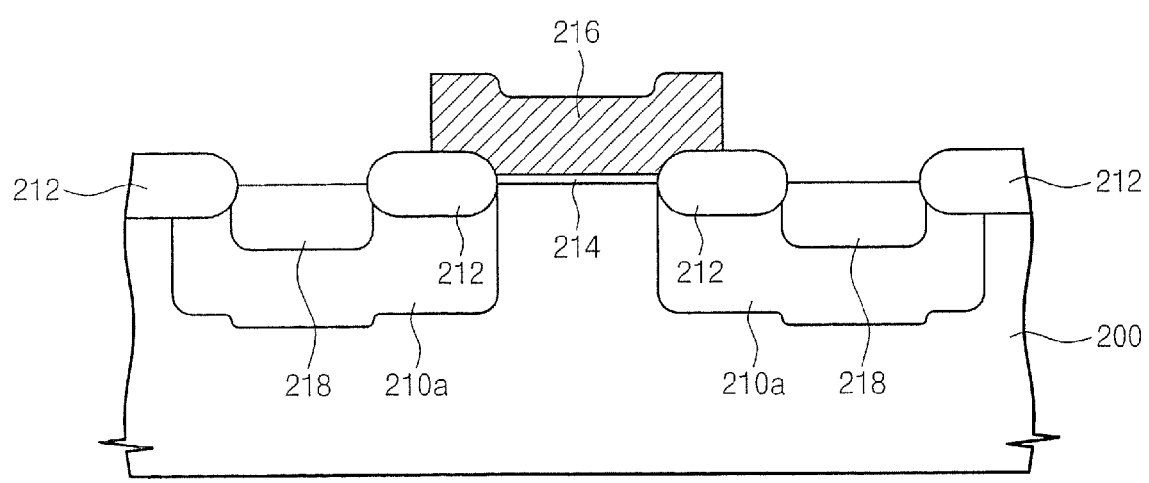

Referring to FIG. 12A and FIG. 12B, a gate insulation layer 214 is formed on top surface of the first and the second substrate regions 203 and 205. A gate conductive layer is formed on the semiconductor substrate 200 having the gate insulation layer 214, and the gate conductive layer is patterned to form a gate 216. The gate 216 runs over the entire top surface of the first substrate region 203. Also, the gate 216 covers a portion of the field insulation layer 212 interposed between the first and the second substrate regions 203 and 205.

A second ion implantation process is performed on the pair of the second substrate regions 205 to form a lightly doped region 210a. The second ion implantation process may be performed under the same conditions as the second ion implantation process described above. Alternatively, the second ion implantation process may be omitted. In this case, the dopant in the preliminary lightly doped region 210 may be diffused to the second substrate region 205 by a thermal process to form the lightly doped region 210a.

A third ion implantation process is performed on the second substrate region 205 to form a heavily doped region 218, using the gate 216 and the field insulation layer 212 as mask. The third ion implantation process may be performed under the same conditions as the third ion implantation process described above.

The semiconductor device of FIG. 8A and FIG. 8B may be realized by forming an interlayer dielectric 220 of FIG. 8B and forming a contact plug 222 of FIG. 8A and FIG. 8B, on the semiconductor substrate 200.

In methods of forming the aforementioned semiconductor devices, by forming the first hard mask pattern 202 in a form that defines the first substrate regions 203a, 203b, 203c and 203d shown in FIGS. 9A, 9B, 9C and 9D, the semiconductor device of FIGS. 9A, 9B, 9C and 9D may be realized.

As described above, according to some embodiments of the present invention, a first substrate region including a channel region and a second substrate region where a heavily doped region is formed are spaced from each other. The channel region includes a small-width first portion and a large-width second portion, and the small-width first portion is disposed close to the second substrate region. Accordingly, the difference in width between portions of the channel region and the heavily doped region facing each other may be decreased. Thus, conventional convergence of electric field is reduced or minimized so that the turn-on breakdown voltage of high voltage-control MOS transistor may be increased.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A field effect transistor comprising:
a substrate;
a field insulation layer disposed in the substrate, the field insulation layer defining a first substrate region and a second substrate region spaced apart from each other;
a gate on the first substrate region;
a channel region defined in the first substrate region under the gate, the channel region comprising a first portion having a first width under the gate and a second portion having a second width under the gate, along a channel width direction that is transverse to a direction from the first substrate region to the second substrate region;
a heavily doped region in the second substrate region; and
a lightly doped region in the substrate surrounding a sidewall and a bottom surface of the heavily doped region,
wherein the first portion is interposed between the second substrate region and the second portion, the first portion is adjacent to the field insulation layer between the first and the second substrate regions, and the first width under the gate is smaller than the second width under the gate; and
wherein the first width under the gate is defined by a first distance between opposite ends of the channel region under the gate, and the second width under the gate is defined by a second distance between opposite ends of the channel region under the gate.

2. The field effect transistor of claim 1, wherein the second substrate region has a third width along the channel width direction, and the second width is larger than the third width.

3. The field effect transistor of claim 2, wherein the lightly doped region has a fourth width along the channel width direction, and the second width is larger than the fourth width.

4. The field effect transistor of claim 2, wherein the first width is equal to or smaller than the third width and is equal to or larger than half of the third width.

5. The field effect transistor of claim 1, wherein the gate extends along a portion of the field insulation layer interposed between the first and the second substrate regions.

6. The field effect transistor of claim 1 further comprising a heavily doped source region in the first substrate region at one side of the gate.

7. The field effect transistor of claim 6, wherein a width along the channel width direction of the first substrate region where the source heavily doped region is formed is equal to the second width.

8. The field effect transistor of claim 1, wherein the field insulation layer defines the first substrate region and a pair of the second substrate regions, the first substrate region is interposed between the pair of the second substrate regions; the gate is on an entire surface of the first substrate region; the channel region comprises a pair of the first portions and the second portion, the second portion is interposed between the pair of the first portions; and the channel region has a symmetrical structure centered about the second portion.

9. The field effect transistor of claim 8, wherein a pair of the heavily doped regions are in the pair of the second substrate regions, respectively; a pair of the lightly doped regions are disposed on opposite sides of the channel region, respectively; and the pair of the lightly doped regions surround the pair of the heavily doped regions, respectively.

10. The field effect transistor of claim 1, wherein a width of the channel region gradually increases from the first portion to the second portion.

11. The field effect transistor of claim 1, wherein a width of the channel region increases in at least one step from the first portion to the second portion.

12. The field effect transistor of claim 1, wherein a side connecting edges of the first and the second portions in the channel region is a concave-curved side or a convex-curved side.

13. A method of forming a field effect transistor comprising:
forming a field insulation layer defining a first substrate region and a second substrate region spaced apart from each other in a substrate;
forming a lightly doped region in the substrate;
forming a gate on the first substrate region; and
forming a heavily doped region in the second substrate region,
wherein a channel region defined in the first substrate region under the gate comprises a first portion having a first width under the gate and a second portion having a second width under the gate in a channel width direction that is transverse to a direction from the first substrate region to the second substrate region, the first portion is interposed between the second substrate region and the second portion and is adjacent to the field insulation layer between the first and the second substrate regions, the first width under the gate is smaller than the second width under the gate, and the lightly doped region surrounds a sidewall and a bottom surface of the heavily doped region; and wherein the first width under the gate is defined by a first distance between opposite ends of the channel region under the gate, and the second width under the gate is defined by a second distance between opposite ends of the channel region under the gate.

14. The method of claim 13, wherein forming the lightly doped region and the field insulation layer comprise:

forming a first hard mask pattern and a second hard mask pattern spaced from each other on the substrate;

forming a mask pattern having an opening on the substrate;

implanting dopant ions in a low dose to a portion of the substrate using as a mask the first and the second hard mask patterns and the mask pattern;

removing the mask pattern;

forming the field insulation layer on the substrate where the first and the second hard mask patterns are not formed; and removing the first and the second hard mask patterns, wherein the opening defines the lightly doped region.

15. The method of claim 14, wherein the implanted low-dose dopant ions are diffused to the second substrate region by a thermal process to form the lightly doped region.

16. The method of claim 14, wherein forming the lightly doped region further comprises implanting the second low-dose dopant ions through the second substrate region.

17. The method of claim 13, wherein the second width is formed larger than a width of the lightly doped region in the channel width direction.

18. The method of claim 13, wherein the second substrate region has a third width along the channel width direction, and the first width is equal to or smaller than the third width and is equal to or larger than half of the third width.

19. The method of claim 13 further comprising forming a heavily doped source region in the first substrate region on one side of the gate.

20. The method of claim 13, wherein the field insulating layer defines the first substrate region and a pair of the second substrate regions, the first substrate region interposed between the pair of the second substrate regions, the gate is formed on an entire surface of the first substrate region, the channel region comprises the pair of the first portions and the second portion, the second portion is interposed between the pair of the first portions, the channel region is formed in a symmetrical structure centered about the second portion, a pair of the heavily doped region are formed in the pair of the second substrate regions, respectively, and a pair of the lightly doped region are formed on opposite sides of the channel region to surround the pair of the heavily doped regions, respectively.

21. The method of claim 13, wherein a width of the channel region is gradually increased from the first portion to the second portion.

22. The method of claim 13, wherein a width of the channel region increases in at least one step from the first portion to the second portion.

23. The method of claim 13, wherein a side connecting edges of the first and the second portions of the channel region is a concave-curved side or a convex-curved side.

24. A field effect transistor comprising: a substrate; a field insulation layer in the substrate that is configured to define first and second substrate regions that are spaced apart from one another in a length direction and that also extend linearly along a width direction that is orthogonal to the length direction, the field insulation layer that defines the first substrate region having different widths at corresponding different lengths away from the second substrate region so that the first substrate region also has different widths at corresponding different lengths away from the second substrate region, the field insulation layer also having same widths on opposite sides of the field insulation layer between the first and second substrate regions so that the first and second substrate regions have same widths on facing surfaces of the first and the second substrate regions; a gate on at least a portion of the first substrate region that has different widths at corresponding different lengths away from the second substrate region, the gate also extending linearly along the width direction; and a source/drain region in the second substrate region.

25. The field effect transistor of claim 24 wherein the field insulation layer that defines the first substrate region increases in width as a function of increasing length away from the second substrate region so that the first substrate region also increases in width as a function of increasing length away from the second substrate region.

26. The field effect transistor of claim 24 wherein the field insulation layer that defines the first substrate region increases in width linearly, stepwise, concavely and/or convexly as a function of increasing length away from the second substrate region so that the first substrate region also increases in width linearly, stepwise, concavely and/or convexly as a function of increasing length away from the second substrate region.

27. The field effect transistor of claim 24 wherein the source/drain region comprises a heavily doped source/drain region in the second substrate region and a lightly doped source drain region in the second substrate region beneath the heavily doped source/drain region and extending to beneath the field insulation layer that defines the second substrate region.

28. The field effect transistor of claim 24 wherein the source/drain region is a first source/drain region, the field effect transistor further comprising a second source/drain region in the first substrate region remote from the first source/drain region.

29. The field effect transistor of claim 28 wherein the second source/drain region comprises a heavily doped source/drain region in the first substrate region and extending from the gate to the field insulation layer that defines the first substrate region and a lightly doped source drain region in the first substrate region beneath the heavily doped source/drain region and extending from the gate to beneath the field insulation layer that defines the first substrate region.

30. The field effect transistor of claim 24 wherein the first substrate region includes a minimum width and wherein the second substrate region is of uniform width corresponding to the minimum width.

31. The field effect transistor of claim 24 wherein the field insulation layer is configured to define a pair of second substrate regions, a respective one of which is on a respective opposite side of the first substrate region, the field insulation layer that defines the first substrate region having different widths at corresponding different lengths away from the second substrate regions so that the first substrate region also has different widths at corresponding different lengths away from the second substrate regions; the field effect transistor further comprising a source/drain region in each of the second substrate regions.

32. The field effect transistor of claim 30 wherein the different widths are symmetrical about an axis of symmetry.

* * * * *